United States Patent [19]

Suzuki

[11] Patent Number: 4,710,136

[45] Date of Patent: Dec. 1, 1987

[54] MOUNTING STRUCTURE FOR ELECTRONIC APPARATUS OR THE LIKE

[75] Inventor: Takeshi Suzuki, Tokyo, Japan

[73] Assignee: Nippon Electric Co., Ltd., Japan

[21] Appl. No.: 722,195

[22] Filed: Apr. 11, 1985

Related U.S. Application Data

[63] Continuation of Ser. No. 468,698, Feb. 22, 1983, abandoned.

[30] Foreign Application Priority Data

Feb. 26, 1982 [JP] Japan ............................... 57-26910[U]

[51] Int. Cl.[4] .......................................... H01R 13/62
[52] U.S. Cl. ..................................... 439/374; 165/78; 165/185; 361/388; 439/297; 439/487
[58] Field of Search ..................... 339/65, 66 R, 66 M, 339/75 R, 75 M, 112 R; 361/388, 389; 165/78, 185

[56] References Cited

U.S. PATENT DOCUMENTS

| | | | |
|---|---|---|---|
| 2,672,506 | 3/1954 | Schulz | 339/66 R |
| 2,735,965 | 2/1956 | Balanda | 339/75 M |
| 2,789,024 | 4/1957 | Heisler | 339/75 M |
| 2,965,819 | 12/1960 | Rosenbaum | 165/185 |
| 3,014,160 | 12/1961 | Brogden | 339/66 R |
| 3,059,184 | 10/1962 | Germain | 361/389 |
| 3,081,824 | 3/1963 | McCall | 165/185 |
| 3,129,044 | 4/1964 | Lyman, Jr. et al. | 339/66 M |
| 3,182,280 | 5/1965 | Daux et al. | 339/66 M |
| 3,372,737 | 3/1968 | Schnell | 165/185 |
| 3,699,394 | 10/1972 | Schuler | 361/389 |
| 3,757,219 | 9/1973 | Aksu | 339/75 M |
| 3,904,262 | 9/1975 | Cutchaw | 339/112 R |
| 3,991,346 | 11/1976 | Reid et al. | 361/388 |
| 4,033,660 | 7/1977 | Ericson et al. | 339/112 R |
| 4,432,038 | 2/1984 | Bell | 339/112 R |
| 4,535,385 | 8/1985 | August et al. | 361/388 |

FOREIGN PATENT DOCUMENTS

| | | | |
|---|---|---|---|
| 791236 | 7/1968 | Canada | 361/388 |
| 1197168 | 7/1965 | Fed. Rep. of Germany | 361/388 |
| 2701188 | 7/1978 | Fed. Rep. of Germany | 339/66 R |
| 671311 | 4/1952 | United Kingdom | 165/185 |
| 0758329 | 8/1980 | U.S.S.R. | 339/65 |

OTHER PUBLICATIONS

"Hook and Loop Thermal Conductive Mesh", IBM Tech. Disclosure Bulletin, by H. Parsapour, vol. 21, No. 9, Feb. 1979.

Primary Examiner—Gil Weidenfeld
Assistant Examiner—Gary F. Paumen
Attorney, Agent, or Firm—Laff, Whitesel, Conte & Saret

[57] ABSTRACT

A structure for mounting an electronic apparatus comprises a pair of opposed side members each having front and rear ends for guiding the apparatus between the front and rear ends of the structure. A rear member has a coupling element for establishing an electrical connection with the electronic apparatus. To make the apparatus retractable with a minimum of effort, the rear member is arranged to movably engage the side members so that when the apparatus is removed from the structure, the rear member is also moved with it, over a predetermined distance, allowing the apparatus to be more firmly gripped for further removal with a greater force that is sufficient to disengage the coupling elements from each other.

7 Claims, 11 Drawing Figures

MOUNTING STRUCTURE FOR ELECTRONIC APPARATUS OR THE LIKE

This is a continuation of U.S. patent application Ser. No. 468,698, filed Feb. 22, 1983, now abandoned.

BACKGROUND OF THE INVENTION

The present invention relates generally to rack-and-panel construction, and in particular to a structure for mounting electronic apparatus or the like.

SUMMARY OF THE INVENTION

It is an object of the present invention to provide a structure for mounting an apparatus having a coupling element which allows the apparatus to be removed therefrom with a minimum of effort.

The stated object is obtained by having a rear member of the mounting structure movable with respect to a pair of opposed side members, by a predetermined distance from the rear of the structure. The movable rear member is provided with a coupling element for engaging the coupling element of the apparatus, so that the latter is allowed to move with a slight forward pull until the rear member of the structure comes to the limit of its travel, whereby the apparatus is brought to a convenient position to be firmly gripped by hands to apply a sufficient force to disengage the coupling elements from each other.

More specifically, the side members each include means for guiding the apparatus between the front and rear ends of the structure for easy insertion and retraction of the apparatus. Preferably, the movable rear member comprises a pair of opposed limb portions slidably engaging recessed portions of the side members and a web portion extending between the limb portions. By reason of this configuration, appropriate spring means may be provided to serve as an aid for dismounting the apparatus.

The present invention is also suitable for applications in which two mating parts of a system are electrically coupled in a companion-chassis relationship. For example, a portable tape recorder is inserted to a companion chassis of a stereo equipment for large volume sound reproduction and retracted from the equipment for personal enjoyment. The invention could also be advantageously adapted for installation of a heavy electronic unit on a rack structure in cases where the electronic unit is frequently removed from the rack for testing purposes.

BRIEF DESCRIPTION OF THE DRAWINGS

The invention will be described in further detail with reference to the accompanying drawings, in which.

BACKGROUND

Figure 1:
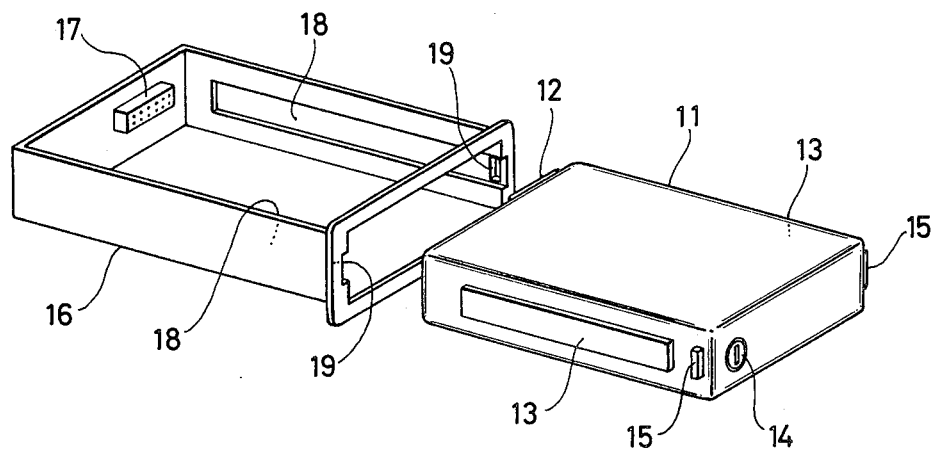
FIG. 1 is a perspective view of the prior-art rack-and-panel construction.

In the past, various types of rack structure have been developed for mounting electronic apparatus such as mobile telephones. FIG. 1 is an illustration of a typical example of such prior-art rack-and-panel constructions. A panel or electronic apparatus 11 is provided with a coupling device 12 at the rear of its housing which provides an electrical junction between the apparatus and an external system and longitudinal guide rails 13 one on each side thereof. Mounting latches or plugs 15 are provided on each side of the housing to form a mechanical fastening device with a key receptacle 14 to prevent unauthorized access to and removal of the apparatus from a rack 16 which is securely fixed to a suitable stationary structure which may be the instrument panel of an automobile.

The rack 16 is of a rectangular, framed construction having on the inner side walls of its side members a pair of opposed guide grooves 18 and a pair of mounting holes 19 for receiving the guide rails 13 and mounting latches or plugs 15 of the apparatus. On the inner wall of the rear panel of the framed structure 16 is a coupling device 17 for mating with the coupling device 12 of the apparatus 11 to establish electrical connection. When the apparatus 11 is inserted into the rack 16 the guide rails 13 of the apparatus slidably engage the grooves 18 of the rack and advances rearwardly until the coupling devices are engaged. The apparatus is locked in place by operating a key in receptacle 14. The apparatus is removed from the rack by unlocking with a key and pulling the apparatus forward. However, the apparatus must be pulled with a force which is sufficient to overcome the force that holds the coupling devices together. This often presents difficulty when removing the apparatus in cases where the stationary structure is not strong enough to permit the rack to be firmly secured thereto. One approach to this problem would be to install a spring between the rear members of the rack 16 and apparatus 11 to serve as an aid for removing the apparatus. However, the spring would likely become too large to install within the limited space.

DETAILED DESCRIPTION

Figure 2:
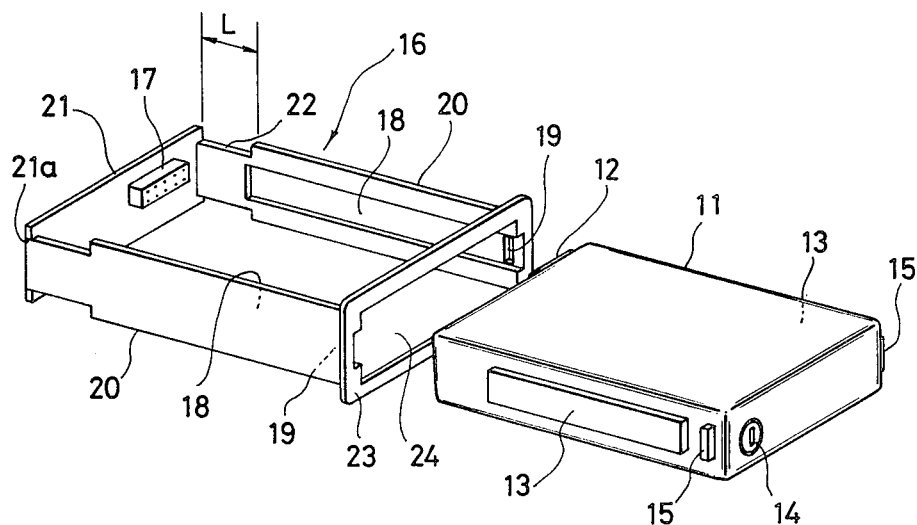
FIG. 2 is a perspective view of an embodiment of the present invention.
Figure 3A:
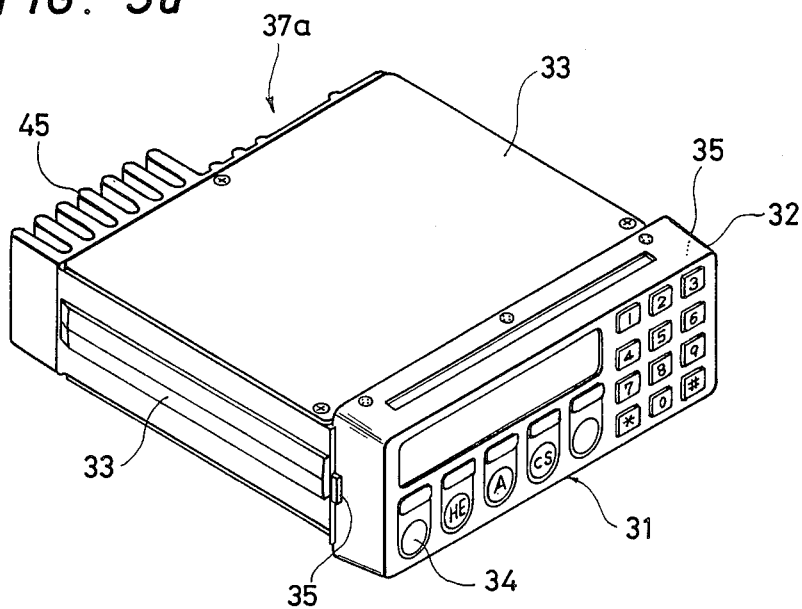
FIGS. 3a to 3c are perspective views of a practical embodiment of the present invention.
Figure 3B:
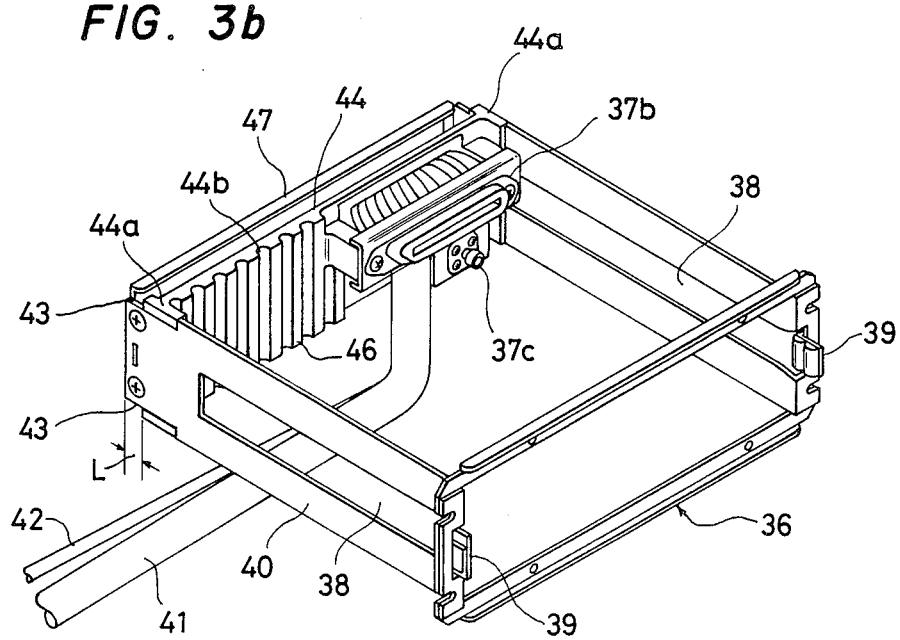
Figure 3C:
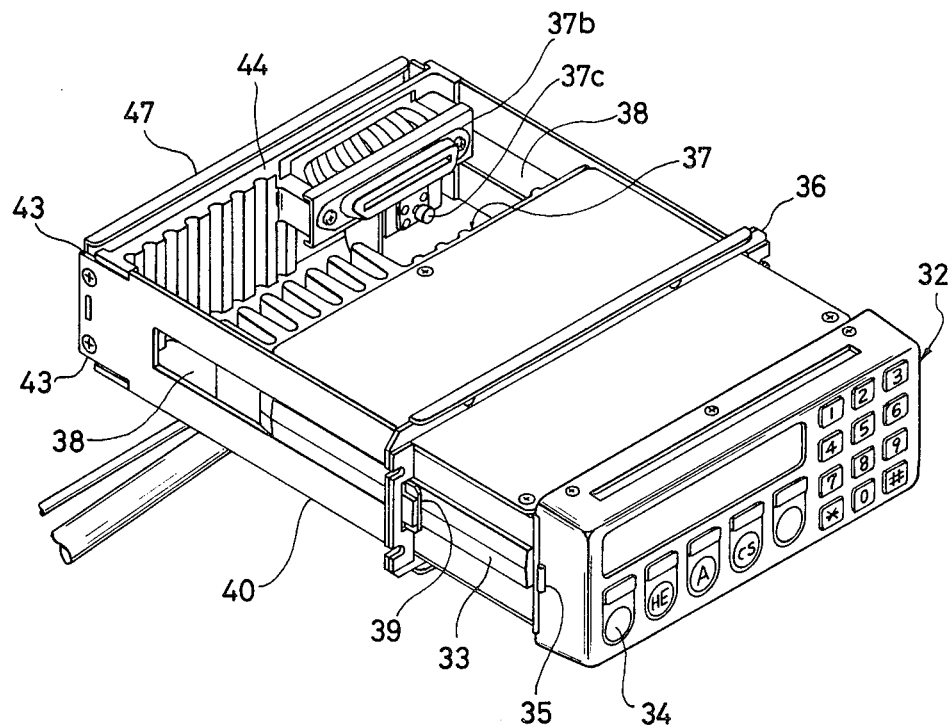

Referring now to FIG. 2, there is shown an embodiment of the present invention in which parts corresponding to those in FIG. 1 are marked with the same reference numerals, as in FIG. 1. The rack 16 comprises a pair of opposed side members 20 which are firmly secured to a stationary structure, not shown, a movable rear end member 21 and a front end member 23 which is secured to the side members 20. The front end member 23 is formed with an opening 24 through which the apparatus 11 is inserted.

According to the invention, the rear member 21 is provided with a pair of recesses 21a at the opposite ends thereof and each side member 20 is formed with a smaller width portion 22 having a pair of opposite guide edges which extend over a length L from the rear end thereof. The smaller width portions 22 snugly fit into the recesses 21a. Provisions may be made at the distal ends of the smaller width portions 22 so that the rear member 21 may not fall apart from the side members 20 when pushed rearward. The rear member 21 is thus movable forward by distance L, with the movement of the apparatus when it is removed from the rack.

The apparatus 11 can be inserted to the rack 16 so that only a small portion of the apparatus remains extended. When retracting the apparatus, the extending portion of the apparatus is gripped and pulled forward. By reason of the structure just described, the apparatus is moved forward with a small amount of force to a position which is convenient for it to be gripped firmly by hands and pulled with a force sufficient to decouple the coupling devices 12 and 17. A typical value of the length L is 20 to 30 millimeters.

Under certain circumstances in which the apparatus may be gripped firmly in a fully inserted position, a forward pull on the apparatus will advantageously develop an inertial force which may, with or without an additional force, be sufficient to overcome the force with which the coupling devices 12 and 17 are connected. In this instance the coupling devices are automatically disengaged from each other and the apparatus is removed substantially in a single operation.

FIGS. 3a–3c and 4a–4c are illustrations of a practical embodiment of the invention. Electronic apparatus 31 is shown as an automobile telephone set having a plurality of controls on a front panel portion 32. At each side of the front panel 32 is a mounting plug 35 which is controlled by a key inserted into lock 34. A guide rail 33 on each side of the apparatus 31 fits into a guide slot 38 formed on each side member 40 of a rack 36. The latter has a pair of lugs 39 forwardly of the guide slots 38, the lugs 39 each having a recess for engaging the associated mounting plug 35 when the apparatus 31 is fully inserted to the rack 36. The apparatus 31 has a pin connector 37a at the rear end for coupling with a female connector 37b for establishing connections from the apparatus to an automobile transmitter circuit or the like through a cable 41. The apparatus is powered through a cable 42 and a female connector 37c. Each side member 40 is formed at the rear with a pair of recesses 43 to act as guide edges for a movable rear member 44. The movable rear member 44 comprises a pair of parallel limb portions 44a and a web portion 44b extending between the limb portions 44a each having a pair of outwardly extending flanges 44c which engage the guide edges 43 of each side member 40. On the rear side of the movable member 44 is a stationary rear member 47 rigidly secured to the rear ends of side members 40 to serve as a stop for the movable rear member 44.

The apparatus 31 is provided with radiator fins 45 at the rear end which come into engagement with radiator fins 46 provided on the movable rear member 44 when the apparatus is fully inserted into the rack 36 to increase the radiating surface.

Figure 4A:
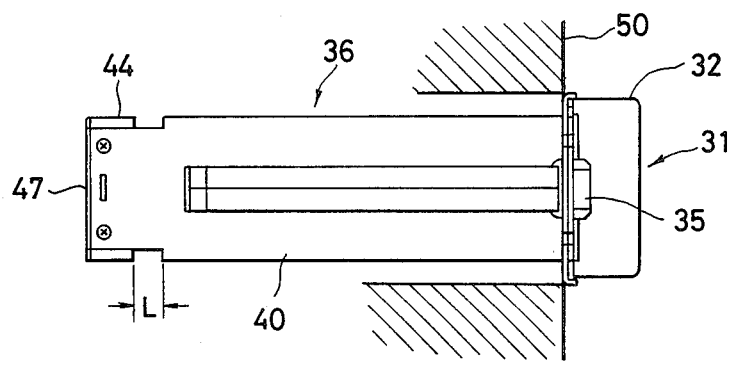
FIGS. 4a to 4c are side views of the practical embodiment.
Figure 4B:
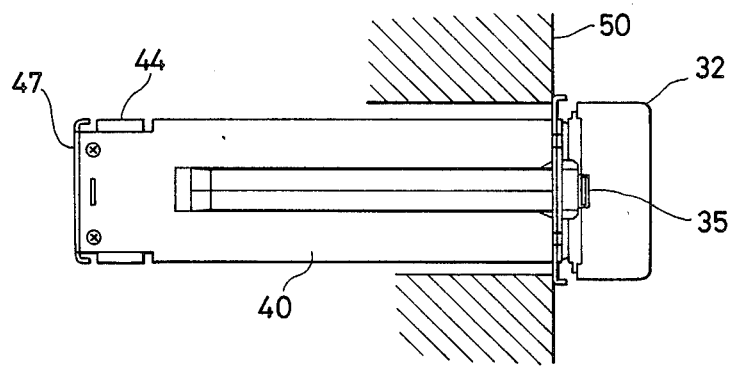
Figure 4C:
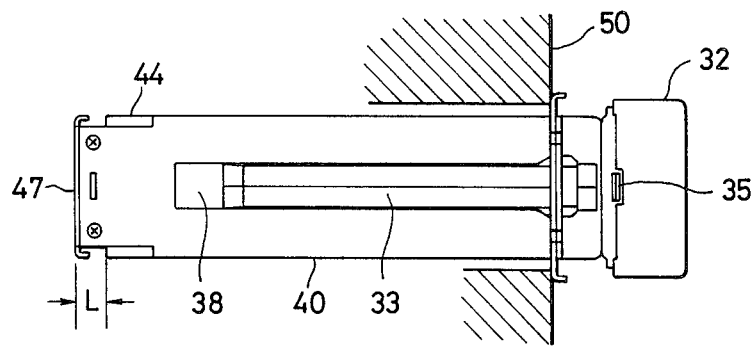

For purposes of description, the rack 36 is mounted in a convenient location of the instrument panel 50 of the vehicle (FIG. 4a). When the apparatus is inserted to the rack 36, the front panel 32 remains extended as shown. In this position there is only a small amount of space and it is difficult to apply a strong pulling force, but the space is sufficient to bring the apparatus (FIG. 4b) to the position of FIG. 4c in which the front panel 32 is sufficiently extended from the instrument panel 50 to permit it to be gripped firmly to disengage the connectors with the use of a greater pulling force.

Figure 5:
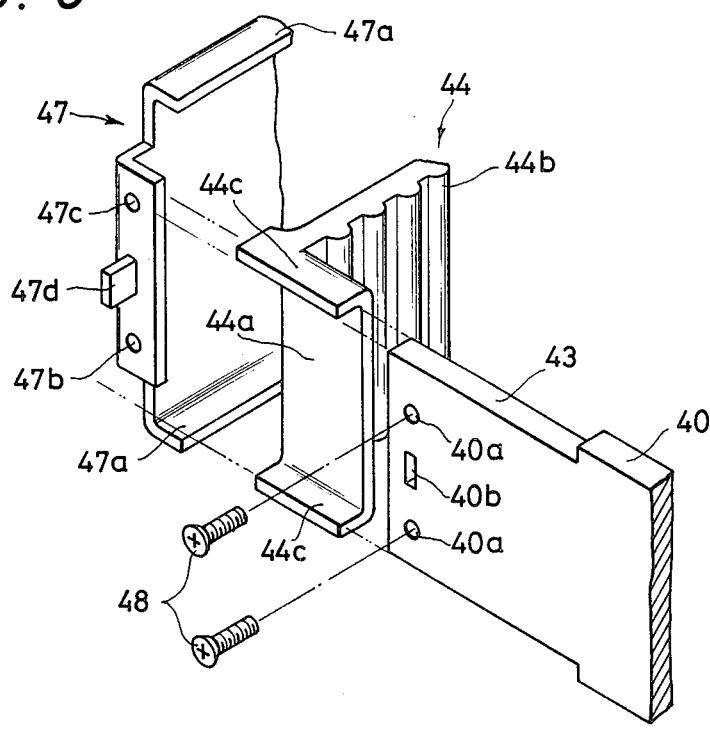
FIG. 5 is an exploded perspective view illustrating details of the movable rear member of FIGS. 3a–3c.

Details of the structure of the rack 36 are shown in an exploded perspective view in FIG. 5. The stationary rear member 47 is a metal sheet formed with a pair of upper and lower flanges 47a which engage the web portion 44b of the movable rear member 44 and a pair of side flanges 47b having a pair of screw holes 47c and a lug 47d. Each side member 40 has a pair of screw holes 40a and a rectangular hole 40b in which the lug 47d engages and the side and stationary rear members are coupled together by screws 48.

Figure 6A:
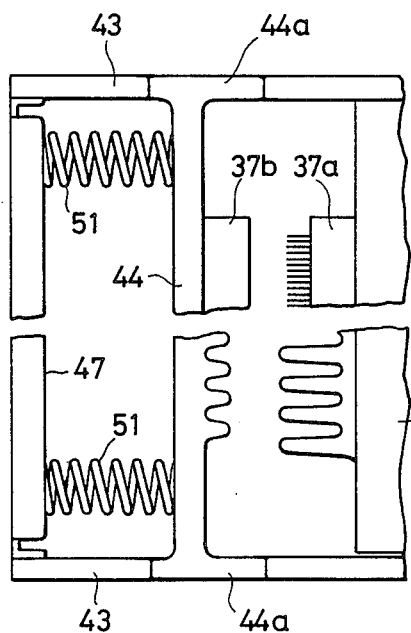
FIGS. 6a and 6b are plan views illustrating a modified embodiment of the invention.
Figure 6B:
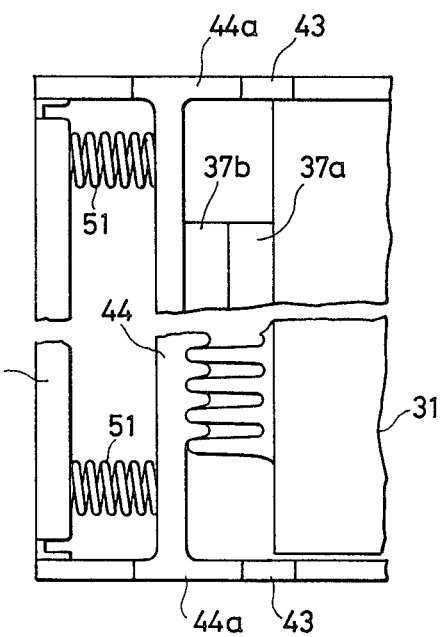

The removing operation can be supplemented by the use of a pair of compression springs 51 secured between the stationary and movable rear members 47 and 44 as shown in FIG. 6a. When the apparatus 31 is fully inserted to the rack 36, the springs 51 are compressed as shown in FIG. 6b. When it is unlocked and pulled forward, the energy stored in the springs is released, providing an additional force to the manual forward pull so that the apparatus may develop enough momentum to spread the connectors 37a and 37b apart as the movable rear member 44 hits the termination of the guide edges 43.

The foregoing description shows only preferred embodiments of the present invention. Various modifications are apparent to those skilled in the art without departing from the scope of the present invention which is only limited by the appended claims. For example, the springs 51 could equally be as well secured to the inside wall of the movable rear member 44 to produce a force spreads the coupling elements apart. Therefore, the embodiments shown and described are only illustrative, not restrictive.

What is claimed is:

1. A structure for mounting an apparatus having at least a pair of opposite sides and front and rear ends, a first coupling device on the rear end of said apparatus for establishing an electrical circuit connection between the apparatus and the structure when the apparatus is inserted into said structure, means for extending said circuit connection to an external source, said structure comprising a pair of opposed stationary side members having front and rear ends for slidably engaging the sides of said apparatus to having a second coupling device for engaging said first coupling device of from said structure, a movable rear member in said structure having a coupling element for engaging the coupling element of said apparatus, said movable rear member being movably engaged with said stationary side members for movement over a predetermined distance along a portion of the length of said side members adjacent to the rear ends of said apparatus and said structure so that the movable rear member is moved over said predetermined distance with said apparatus when said coupling devices are engaged with each other, a first heat radiating member having a plurality of heat dissipating cooling fins secured to said movable rear member for partially radiating heat generated by said apparatus into the air, and a second stationary heat radiating member secured to said apparatus and having a plurality of heat dissipating cooling fins of a configuration which is complementary to the configuration of the fins of said first heat radiating member, the fins of said first and second heat radiating members engaging each other with the fins of said first heat radiating member interdigitating with said fins of said second heat radiating means when said apparatus is inserted into said structure for partially transmitting said heat from said first to said second heat radiating member and for guiding said coupling devices into alignment with each other.

2. A structure as claimed in claim 1, wherein each of said side members is formed with a guide path extending from the rear end thereof over said predetermined distance, and said movable rear member comprises a pair of opposed limb portions slidably engaging said guide paths of said side members and a web portion extending between said limb portions.

3. A structure as claimed in claim 2, wherein each of said limb portions is formed with a groove for slidably engaging said guide path.

4. A structure as claimed in claim 1, wherein each of said side members is provided with a smaller width portion adjacent to the rear end thereof to define a pair of opposite guide edges, and wherein said movable rear member comprises a pair of opposed limb portions and a web portion extending between said limb portions, each of said limb portions having a pair of flanges engaging said guide edges of each of said side members.

5. A structure as claimed in claim 1, further comprising a second rear member securely fixed to the rear ends of said side members, said movable rear member being movable from said second rear member by said distance.

6. A structure as claimed in claim 5, further comprising spring means secured between said second rear member and said movable rear member.

7. A structure as claimed in claim 1, further comprising means for locking said apparatus in said structure.

* * * * *